United States Patent
Chen et al.

(10) Patent No.: US 9,023,698 B2
(45) Date of Patent: May 5, 2015

(54) HIGH PERFORMANCE STRESS-ENHANCED MOSFETS USING SI:C AND SIGE EPITAXIAL SOURCE/DRAIN AND METHOD OF MANUFACTURE

(75) Inventors: Huajie Chen, Danbury, CT (US);
Dureseti Chidambarrao, Weston, CT (US); Omer H. Dokumaci, Wappingers Falls, NY (US)

(73) Assignee: Samsung Electronics Co., Ltd. (KR)

( * ) Notice: Subject to any disclaimer, the term of this patent is extended or adjusted under 35 U.S.C. 154(b) by 41 days.

(21) Appl. No.: 13/446,609

(22) Filed: Apr. 13, 2012

(65) Prior Publication Data

US 2012/0196412 A1    Aug. 2, 2012

Related U.S. Application Data

(60) Division of application No. 11/782,429, filed on Jul. 24, 2007, now Pat. No. 8,168,489, which is a continuation of application No. 10/689,506, filed on Oct. 20, 2003, now Pat. No. 7,303,949.

(51) Int. Cl.
| | |
|---|---|
| H01L 21/8238 | (2006.01) |
| H01L 29/78 | (2006.01) |
| H01L 29/10 | (2006.01) |
| H01L 29/66 | (2006.01) |
| H01L 27/092 | (2006.01) |

(52) U.S. Cl.
CPC .... *H01L 29/7848* (2013.01); *H01L 21/823807* (2013.01); *H01L 21/823814* (2013.01); *H01L 29/1054* (2013.01); *H01L 29/66628* (2013.01); *H01L 29/66636* (2013.01); *H01L 2924/0002* (2013.01); *H01L 27/092* (2013.01)

(58) Field of Classification Search
USPC .......................................................... 438/230
See application file for complete search history.

(56) References Cited

U.S. PATENT DOCUMENTS

| | | | |
|---|---|---|---|
| 3,602,841 | A | 8/1971 | McGroddy |
| 4,665,415 | A | 5/1987 | Esaki et al. |
| 4,853,076 | A | 8/1989 | Tsauer et al. |
| 4,855,245 | A | 8/1989 | Neppl et al. |

(Continued)

FOREIGN PATENT DOCUMENTS

| | | | |
|---|---|---|---|
| DE | 4233236 | * | 4/1993 |
| JP | 6476755 | | 3/1989 |

(Continued)

OTHER PUBLICATIONS

Search Reporting and Written Opinion for PCT/US04/34562, dated Mar. 15, 2007.

(Continued)

*Primary Examiner* — Stephen W Smoot
(74) *Attorney, Agent, or Firm* — Myers Bigel Sibley & Sajovec, PA

(57) ABSTRACT

A semiconductor device and method of manufacturing a semiconductor device. The semiconductor device includes channels for a pFET and an nFET. A SiGe layer is selectively grown in the source and drain regions of the pFET channel and a Si:C layer is selectively grown in source and drain regions of the nFET channel. The SiGe and Si:C layer match a lattice network of the underlying Si layer to create a stress component. In one implementation, this causes a compressive component in the pFET channel and a tensile component in the nFET channel.

20 Claims, 5 Drawing Sheets

(56) References Cited

U.S. PATENT DOCUMENTS

| | | |
|---|---|---|
| 4,952,524 A | 8/1990 | Lee et al. |
| 4,958,213 A | 9/1990 | Eklund |
| 5,006,913 A | 4/1991 | Sugahara et al. |
| 5,060,030 A | 10/1991 | Hoke |
| 5,081,513 A | 1/1992 | Jackson et al. |
| 5,108,843 A | 4/1992 | Ohtaka et al. |
| 5,134,085 A | 7/1992 | Gilgen et al. |
| 5,310,446 A | 5/1994 | Konishi et al. |
| 5,354,695 A | 10/1994 | Leedy |
| 5,371,399 A | 12/1994 | Burroughes et al. |
| 5,391,510 A | 2/1995 | Hsu et al. |
| 5,459,346 A | 10/1995 | Asakawa et al. |
| 5,471,948 A | 12/1995 | Burroughes et al. |
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy |
| 5,592,007 A | 1/1997 | Leedy |
| 5,592,018 A | 1/1997 | Leedy |
| 5,670,798 A | 9/1997 | Schetzina |
| 5,679,965 A | 10/1997 | Schetzina |
| 5,683,934 A | 11/1997 | Candelaria |
| 5,840,593 A | 11/1998 | Leedy |
| 5,861,651 A | 1/1999 | Brasen et al. |
| 5,880,040 A | 3/1999 | Sun et al. |
| 5,940,736 A | 8/1999 | Brady et al. |
| 5,946,559 A | 8/1999 | Leedy |
| 5,960,297 A | 9/1999 | Saki |
| 5,989,978 A | 11/1999 | Peidous |
| 6,008,126 A | 12/1999 | Leedy et al. |
| 6,025,280 A | 2/2000 | Brady et al. |
| 6,046,464 A | 4/2000 | Schetzina |
| 6,066,545 A | 5/2000 | Doshi et al. |
| 6,090,684 A | 7/2000 | Ishitsuka et al. |
| 6,107,143 A | 8/2000 | Park et al. |
| 6,117,722 A | 9/2000 | Wuu et al. |
| 6,133,071 A | 10/2000 | Nagai |
| 6,165,383 A | 12/2000 | Chou |
| 6,165,826 A | 12/2000 | Chau et al. |
| 6,221,735 B1* | 4/2001 | Manley et al. ............... 438/426 |
| 6,228,694 B1 | 5/2001 | Doyle et al. |
| 6,246,095 B1 | 6/2001 | Brady et al. |
| 6,255,169 B1 | 7/2001 | Li et al. |
| 6,261,964 B1 | 7/2001 | Wu et al. |
| 6,265,317 B1 | 7/2001 | Chiu et al. |
| 6,274,444 B1 | 8/2001 | Wang |
| 6,281,532 B1 | 8/2001 | Doyle et al. |
| 6,284,623 B1 | 9/2001 | Zhang et al. |
| 6,284,626 B1 | 9/2001 | Kim |
| 6,319,794 B1 | 11/2001 | Akatsu et al. |
| 6,361,885 B1 | 3/2002 | Chou |
| 6,362,082 B1 | 3/2002 | Doyle et al. |
| 6,368,931 B1 | 4/2002 | Kuhn et al. |
| 6,403,486 B1 | 6/2002 | Lou |
| 6,403,975 B1 | 6/2002 | Brunner et al. |
| 6,406,973 B1 | 6/2002 | Lee |
| 6,461,936 B1 | 10/2002 | Von Ehrenwall |
| 6,475,869 B1 | 11/2002 | Yu |
| 6,476,462 B2 | 11/2002 | Shimizu et al. |
| 6,483,171 B1 | 11/2002 | Forbes et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,509,618 B2 | 1/2003 | Jan et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 6,573,172 B1 | 6/2003 | En et al. |
| 6,717,216 B1 | 4/2004 | Doris et al. |
| 6,724,019 B2 | 4/2004 | Oda et al. |
| 6,774,409 B2 | 8/2004 | Baba et al. |
| 6,825,529 B2 | 11/2004 | Chidambarrao et al. |
| 6,831,292 B2 | 12/2004 | Currie et al. |
| 6,891,192 B2 | 5/2005 | Chen et al. |
| 6,921,913 B2 | 7/2005 | Yeo et al. |
| 6,946,371 B2 | 9/2005 | Langdo et al. |
| 6,955,952 B2 | 10/2005 | Yeo et al. |
| 6,974,981 B2 | 12/2005 | Chidambarrao et al. |
| 6,977,194 B2 | 12/2005 | Belyansky et al. |
| 6,982,465 B2 | 1/2006 | Kumagai et al. |
| 7,015,082 B2 | 3/2006 | Doris et al. |
| 7,022,561 B2 | 4/2006 | Huang et al. |
| 7,105,394 B2 | 9/2006 | Hachimine et al. |
| 2001/0009784 A1 | 7/2001 | Ma et al. |
| 2001/0036709 A1* | 11/2001 | Andrews et al. ............... 438/424 |
| 2002/0063292 A1 | 5/2002 | Armstrong et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2002/0125502 A1 | 9/2002 | Baba et al. |
| 2003/0022460 A1 | 1/2003 | Park |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2003/0080361 A1 | 5/2003 | Murthy et al. |
| 2004/0108533 A1* | 6/2004 | Chen et al. .................. 257/296 |
| 2004/0113174 A1 | 6/2004 | Chidambarrao et al. |
| 2004/0173815 A1 | 9/2004 | Yeo et al. |
| 2004/0235236 A1 | 11/2004 | Hoffmann et al. |
| 2004/0238914 A1 | 12/2004 | Deshpande et al. |
| 2004/0253776 A1 | 12/2004 | Hoffmann et al. |
| 2004/0256614 A1* | 12/2004 | Ouyang et al. .................. 257/20 |
| 2004/0262784 A1 | 12/2004 | Doris et al. |
| 2005/0035470 A1 | 2/2005 | Ko et al. |
| 2005/0040460 A1 | 2/2005 | Chidambarrao et al. |
| 2005/0051851 A1 | 3/2005 | Chen et al. |
| 2005/0082634 A1 | 4/2005 | Doris et al. |
| 2005/0093030 A1 | 5/2005 | Doris et al. |
| 2005/0098829 A1 | 5/2005 | Doris et al. |
| 2005/0106799 A1 | 5/2005 | Doris et al. |
| 2005/0145954 A1 | 7/2005 | Zhu et al. |
| 2005/0148146 A1 | 7/2005 | Doris et al. |
| 2005/0184345 A1* | 8/2005 | Lin et al. ........................ 257/375 |
| 2005/0194699 A1 | 9/2005 | Belyansky et al. |
| 2005/0236668 A1 | 10/2005 | Zhu et al. |
| 2005/0245017 A1 | 11/2005 | Belyansky et al. |
| 2005/0280051 A1 | 12/2005 | Chidambarrao et al. |
| 2005/0282325 A1 | 12/2005 | Belyansky et al. |
| 2006/0017138 A1 | 1/2006 | Ting |
| 2006/0027868 A1 | 2/2006 | Doris et al. |
| 2006/0057787 A1 | 3/2006 | Doris et al. |
| 2006/0060925 A1 | 3/2006 | Doris et al. |

FOREIGN PATENT DOCUMENTS

| | | |
|---|---|---|
| JP | 2002270826 | 9/2002 |
| JP | 2003086708 A | 3/2003 |
| TW | 477025 | 2/2002 |
| WO | WO0243151 | 5/2002 |

OTHER PUBLICATIONS

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al., "Temperature Dependence of Emitter-Base Reverse Stress Degradation and its Mechanism Analyzed by MOS Structures." 1989 IEEE, Paper 6.2, pp. 140-143.

C.J. Huang, et al., "Temperature Dependence and Post-Stress Recovery of Hot Electron Degradation Effects in Bipolar Transistors." IEEE 1991, Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003, IEEE GaAs Digest, pp. 263-266.

(56) References Cited

OTHER PUBLICATIONS

H. Wurzer, et al., "Annealing of Degraded non-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al. "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft = 350/300 GHz and Gate Delay Below 3.3 ps". 2004 IEEE, 4 pages.

J.C. Bean, et al., "GEx SI 1-x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al. "Heterojuction Bipolar Transistors Using Si—Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x GEx Strained Layers on (100) Si". Appl. Phys. Lett. 56 (5), Jan. 29, 1990, pp. 460-462.

Q. Quyang et al., "Two-Dimensional Bandgap Engineering in a Novel Si/SiGe pMOSFET with Enhanced Device Performance and Scalability". 2000, IEEE, pp. 151-154.

Kern Rim, et al., "Transconductance Enhancement in Deep Submicron Strained-Si $n$-MOSFETs," International Electron Devices Meeting, 26,8,1, IEEE, Sep. 1998.

Kern Rim, et al., "Characteristics and Device Design of Sub-100 nm Strained Si N- and PMOSFETs," 2002 Symposium on VLSI Technology Digest of Technical Papers, IEEE, pp. 98-99.

Gregory Scott, et al., "NMOS Drive Current Reduction Caused by Transistor Layout and Trench Isolation Induced Stress," International Electron Devices Meeting, 34.4.1, IEEE, Sep. 1999.

F. Ootsuka et al., "A Highly Dens, High-Performance 130nm node CMOS Technology for Large Scale System-on-a-Chip Application," International Electron Devices Meeting, 23.5.1, IEEE, Apr. 2000.

Shinya Ito, et al., "Mechanical Stress Effect of Etch-Stop Nitride and its Impact on Deep Submicron Transistor Design," International Electron Devices Meeting, 10.7.1, IEEE, Apr. 2000.

A. Shimizu, et al., "Local Mechanical-Stress Control (LMC): A New Technique for CMOS-Performance Enhancement," International Electron Devices Meeting, 2.2.1, IEEE, Feb. 2002.

K. Ota, et al., "Novel Locally Strained Channel Technique for High Performance 55nm CMOS," International Electron Devices Meeting, 2.2.1, IEEE, Feb. 2002.

Quirk, Michael, et al.—"Semiconductor Manufacturing Technology"—ISBN 0-13-081520-9—2001, Prentice Hall, New Jersey, USA—pp. 456-466.

Application No. 04 795 693.3—2203 Communication pursuant to Article 94(3) EPC dated Apr. 23, 2010—Examination of identified application.

Application No. 2006-536715 Filing Date: Oct. 19, 2004 Information Materials for IDS cited from JPO Office Action dated Jan. 22, 2013.

* cited by examiner

HIGH PERFORMANCE STRESS-ENHANCED MOSFETS USING SI:C AND SIGE EPITAXIAL SOURCE/DRAIN AND METHOD OF MANUFACTURE

CROSS REFERENCE TO RELATED APPLICATIONS

This application is divisional application of application U.S. application Ser. No. 11/782,429, filed on Jul. 24, 2007, now U.S. Pat. No. 8,168,489, which is a continuation application of U.S. application Ser. No. 10/689,506, filed on Oct. 20, 2003, now U.S. Pat. No. 7,303,949, the contents of which are hereby incorporated by reference in their entirety.

BACKGROUND OF THE INVENTION

1. Field of the Invention

The invention generally relates to a semiconductor device and method of manufacture and, more particularly, to a semiconductor device and method of manufacture which imposes tensile and compressive stresses in the device during device fabrication.

2. Background Description

Mechanical stresses within a semiconductor device substrate can modulate device performance. That is, stresses within a semiconductor device are known to enhance semiconductor device characteristics. Thus, to improve the characteristics of a semiconductor device, tensile and/or compressive stresses are created in the channel of the n-type devices (e.g., NFETs) and/or p-type devices (e.g., PFETs). However, the same stress component, either tensile stress or compressive stress, discriminatively affects the characteristics of an n-type device and a p-type device.

For example, it has been known that a device exhibits better performance characteristics when formed on a silicon layer (or cap) that is epitaxially grown on another epitaxially grown SiGe layer that has relaxed on top of the silicon substrate. In this system, the silicon cap experiences biaxial tensile strain. When epitaxially grown on silicon, an unrelaxed SiGe layer will have a lattice constant that conforms to that of the silicon substrate. Upon relaxation (through a high temperature process for example) the SiGe lattice constant approaches that of its intrinsic lattice constant which is larger than that of silicon. A fully relaxed SiGe layer has a lattice constant close to that of its intrinsic value. When the silicon layer is epitaxially grown thereon, the silicon layer conforms to the larger lattice constant of the relaxed SiGe layer and this applies physical biaxial stress (e.g., expansion) to the silicon layer being formed thereon. This physical stress applied to the silicon layer is beneficial to the devices (e.g., CMOS devices) formed thereon because the expanded silicon layer increases N type device performance and a higher Ge concentration in the SiGe layer improves P type device performances.

Relaxation in SiGe on silicon substrates occurs through the formation of misfit dislocations. For a perfectly relaxed substrate, one can envision a grid of misfit dislocations equally spaced that relieve the stress. The misfit dislocations facilitate the lattice constant in the SiGe layer to seek its intrinsic value by providing extra half-planes of silicon in the substrate. The mismatch strain across the SiGe/silicon interface is then accommodated and the SiGe lattice constant is allowed to get larger.

However, the problem with this conventional approach is that it requires a multi-layered SiGe buffer layer that is very thick (e.g., a thickness of approximately 5000 Å to 15000 Å) to achieve misfit dislocations on its surface portion while avoiding threading dislocations between the SiGe layer and the silicon substrate layer, thereby achieving a relaxed SiGe structure on the surface of the multi-layered SiGe layer. Also, this approach significantly increases manufacturing time and costs. Further, the thick graded SiGe buffer layer cannot be easily applicable to silicon-on-insulator substrate (SOI). This is because for silicon-on-insulator the silicon thickness has to be below 1500 Å for the benefits of SOI to be valid. The SiGe buffered layer structure is too thick.

Another problem is that misfit dislocations formed between the SiGe layer and the silicon epitaxial layer are random and highly non-uniform and cannot be easily controlled due to heterogeneous nucleation that cannot be easily controlled. Also, misfit dislocation densities are significantly different from one place to another. Thus, the physical stress derived from the non-uniform misfit dislocations are apt to be also highly non-uniform in the silicon epitaxial layer, and this non-uniform stress causes non-uniform benefits for performance with larger variability. Further at those locations where misfit density is high, the defects degrade device performances through shorting device terminals and through other significant leakage mechanisms.

It is also known to grow Si:C epitaxially on Si where it is inherently tensile. A 1% C content in a Si:C/Si material stack can cause tensile stress levels in the Si:C on the order of 500 MPa. In comparison, in the SiGe/Si system about 6% Ge is needed to causes a 500 MPa compression. This 1% level of C can be incorporated into Si during epitaxial growth as shown in Ernst et al., VLSI Symp., 2002, p 92. In Ernst et al., Si/Si:C/Si layered channels for nFETs are shown. However in the Ernst et al. structure, the Si:C is provided in the traditional strained Si approach as a stack of layers in the channel. Thus, in the Ernst et al. structure, the Si:C is used as part of the channel, itself. The problem with this approach is that the mobility is not enhanced, but retarded depending on the C content from scattering.

SUMMARY OF THE INVENTION

In a first aspect of the invention, a method of manufacturing a semiconductor structure includes forming a p-type field-effect-transistor (pFET) channel and a negative field-effect-transistor (nFET) channel in a substrate. A pFET stack and an nFET stack are formed on the substrate associated with the respective channels. A first layer of material is provided at source/drain regions associated with the pFET stack. The first layer of material has a lattice constant different than a base lattice constant of the substrate to create a compressive state within the pFET channel. A second layer of material is provided at the source/drain regions associated with the nFET stack. The second layer of material has a lattice constant different than the base lattice constant of the substrate to create a tensile state at the nFET channel.

In another aspect of the invention, a method of manufacturing a semiconductor structure is provided which includes forming a p-type field-effect-transistor (pFET) channel and a negative field-effect-transistor (nFET) channel in a substrate. A pFET structure and an nFET structure are formed on the substrate associated with the pFET channel and the nFET channel, respectively. The regions of the pFET structure and the nFET structure are etched to a predetermined depth. A first material with a lattice constant different than the base lattice constant of the layer is provided in the etched regions of the pFET structure to provide a compressive stress in the pFET channel. A second material with a lattice constant different than the base lattice constant of the layer is provided in the etched regions of the nFET structure to provide a tensile stress in the nFET channel. Doping source and drain regions of the nFET and pFET structures is provided.

In yet another aspect of the invention, a semiconductor structure includes a semiconductor substrate, and a pFET and nFET are formed in respective channels in the substrate. A first layer of material in source and drain regions of the pFET channel has a lattice constant different than the lattice constant of the substrate. A second layer of material in source and drain regions of the nFET channel has a lattice constant different than the lattice constant of the substrate.

DETAILED DESCRIPTION OF EMBODIMENTS OF THE INVENTION

The invention is directed to a semiconductor device and method of manufacture which provides tensile stresses near the nFET channel and compressive stresses near the pFET channel of CMOS devices. In one embodiment of the invention, the longitudinal tensile stresses are brought very close to the nFET channel while at the same time compressive stresses are brought very close to the pFET channel. Additionally, in the invention, a process and structure is provided to integrate both SiGe and Si:C materials into CMOS technology.

By way of example, a highly tensile Si:C film is provided (e.g., embedded) in the silicon substrate in the source/drain (S/D) regions to longitudinally apply tension on the nFET structure in the channel under the gate region thereof. Similarly, a highly compressive SiGe film is provided (e.g., embedded) in the silicon substrate in the S/D regions to longitudinally apply compression on the pFET in the channel under the gate region thereof. Similar to the SiGe layer, the Si:C layer is relatively thin (below its critical thickness) and is not relaxed. The transistor channel region of the nFET is strained by the stress from the Si:C layer, while the channel region of the pFET is provided with compressive stress from the SiGe.

Since the SiGe layer is embedded in the S/D region of the pFET, low resistance silicide can still be formed. Interestingly, embedded (e.g., sub-surface or coplanar-to-surface) Si:C films can put larger stresses than the above-surface Si:C counterparts because of the film surface not being free. In this invention, the different thicknesses and protrusions of the Si:C, whether embedded or coplanar with the surface or raised, are contemplated. It should be understood that by adjusting the concentrations of the Ge content in the SiGe layer, it is possible to adjust the compressive stress in the pFET channel. Similarly, it is possible to adjust the tensile stress in the nFET channel by adjusting the concentrations of C in the Si:C layer. This is due to the lattice constant of such materials.

In the invention, it is shown that Si:C has a correct stress, that it includes the correct amount of C content, and that it can be grown epitaxially and selectively. Also, in the invention, the Si:C is not used as a directly built up stacked layer under the channel but as a replacement material for nFET S/D regions that are in tension and therefore imposing tension in the channel region. This Si:C film therefore applies tensile stress to nFET channels while the SiGe applies compressive stress to the pFET channels.

Figure 1A:
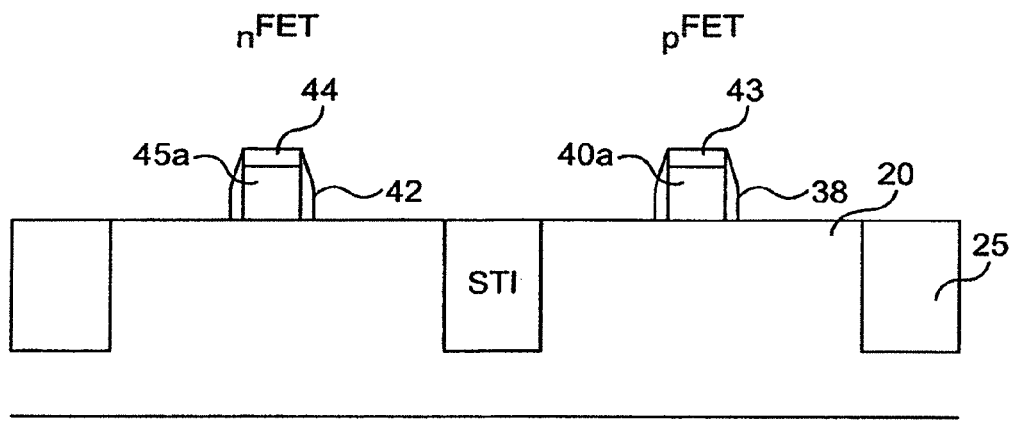
FIGS. 1a through 1e represent a fabrication process to form a device in accordance with the invention.

FIGS. 1a through 1e represent a fabrication process to form a device in accordance with the invention. In FIG. 1a, a silicon-on-insulator (SOI) 20 or the like is provided. The layer 20 is patterned to form shallow trench isolation features (STI) 25 using standard techniques of pad oxidation, pad nitride deposition, lithography based patterning, reactive ion etching (RIE) of the stack consisting of nitride, oxide, and silicon down to the buried oxide, edge oxidation, liner deposition, fill deposition, and chemical mechanical polish, for example. The STI formation process is well known in the art. The pad nitride is then stripped. The gate stacks comprising, for example, gate dielectric and poly silicon are formed on the structure to form the pFETs and the nFETs, in any well known method. TEOS caps 43 and 44 are formed with the pPETs and nFETs in a known manner.

Still referring to FIG. 1a, spacers are formed on the pFET and nFET stacks, respectively, using any well known process. By way of example, spacers 38 are formed on the side walls of the pFET stack 40a and spacers 42 are formed on the sidewalls of the nFET stack 45a. The spacers may be oxide or nitride spacers, for example.

Figure 1B:
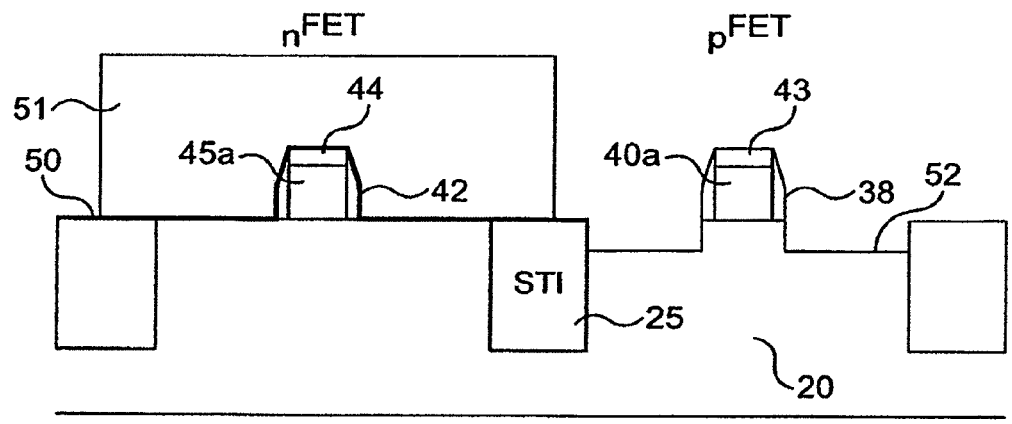

In FIG. 1b, a thin liner 50 is blanket deposited over the structure including the pFET stack, nFET stack and S/D regions thereof, for example. The thin liner 50 is, in one embodiment, a $Si_3N_4$ liner or any of a nitride or oxide based material depending on the material of a hard mask. The thickness range of the thin liner is approximately 5 to 20 nm. The thin liner 50 may act as a protection layer. A hard mask 51 is then formed over the nFET stack 45a and S/D regions thereof.

Figure 1C:
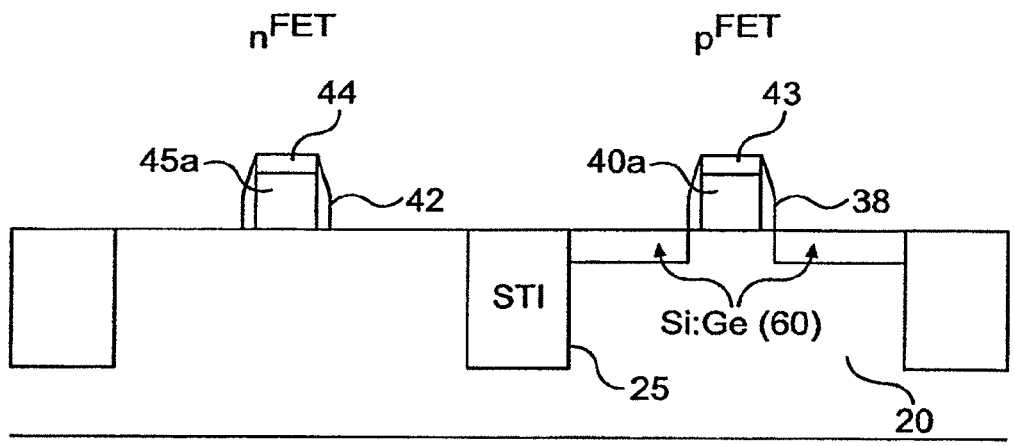

Regions about the pFET stack 40a are etched to the liner 50. The liner 50 is then etched and S/D regions 52 are formed (etched) adjacent the stack 40a. The depth of S/D regions 52 is about 20 to 100 nm, depending on the thickness of the SOI layer. A highly compressive selective epitaxial SiGe layer 60 is grown in the regions 52 of the pFET stack 40a as shown in FIG. 1c, fully filling the S/D etched regions 52. The SiGe layer 60 may be grown to a thickness of about 10 to 100 nm thick, although other thicknesses are also contemplated by the invention. In one implementation, the SiGe layer is grown to a thickness above the surface of the gate oxide. The hard mask and remaining portions of the liner are removed using any well known process such as, for example, wet chemicals. In processing steps, dopants are ion implanted to form the S/D regions about the pFET stack 40a prior to removing the hard mask.

Standing alone, the SiGe normally has a larger lattice constant than the SOI. That is, the lattice constant of the SiGe material does not match the lattice constant of the Si. However, in the structure of the invention, due to the growth of the SiGe layer, the lattice structure of the SiGe layer will tend to match the lattice structure of the underlying Si. This results in the SiGe layer and the channel regions adjacent or next to the SiGe being under compression. In one embodiment, the Ge content of the SiGe layer may be greater than 0% and upwards ratio to the Si content.

Figure 1D:
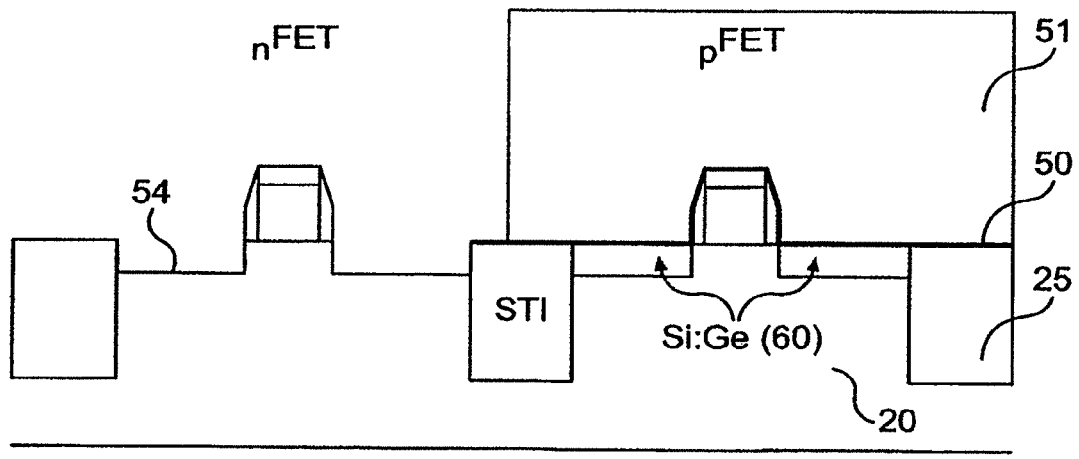

Still referring to the processing of the invention, in FIG. 1d, a thin liner 50 is again blanket deposited over the structure including the nFET, pFET and S/D regions thereof, for example. The thin liner 50 is, in one embodiment, a $Si_3N_4$ liner or any of a nitride or oxide material depending on the material of a hard mask. The thickness range of the thin liner is approximately 5 to 20 nm. The thin liner 50 may act as a protection layer.

A mask 51 is then formed over the pFET stack 40a, and the regions about the nFET stack 45a are etched to the liner 50. The liner is then etched and S/D regions 54 are formed (etched) adjacent the stack 45a. The depth of the S/D regions 54 is about 20 to 100 nm, depending on the thickness of the SOI layer. Any well known process may be used to etch the regions 54.

Figure 1E:
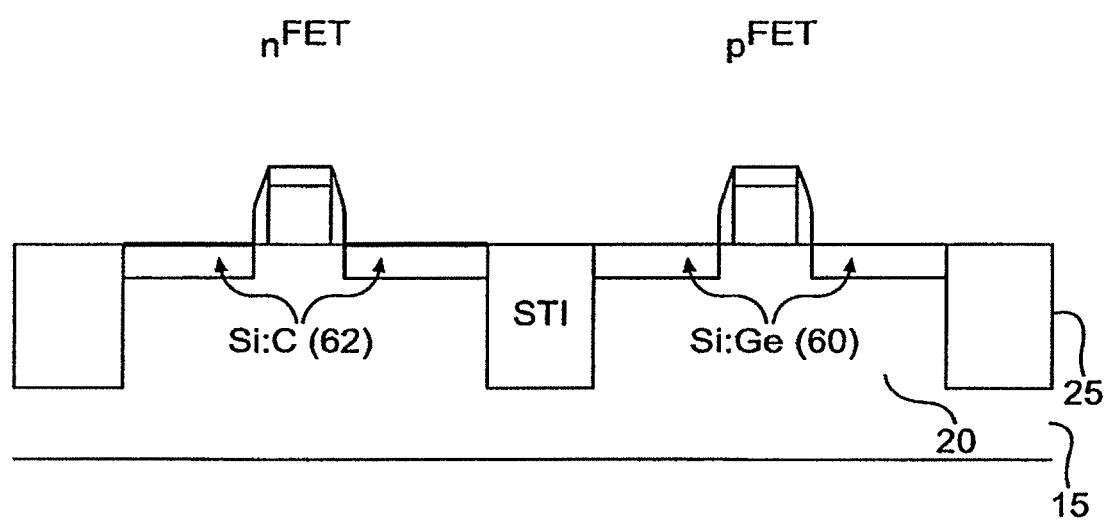

A highly tensile selective epitaxial Si:C layer is grown to a thickness of about 10 to 100 nm thick in the regions 54 of the nFET stack 45a as shown in FIG. 1e. It should be understood that the Si:C layer 62 may be epitaxial grown to other thicknesses, as contemplated by the invention. In one embodiment, the C content may be from greater than 0% to 4% in ratio to the Si content. The resist and remaining portions of the thin liner are removed using any well known process such as, for example using wet chemicals.

Standing alone, Si:C would normally have a smaller lattice constant than the underlying Si. That is, the lattice constant of the Si:C material does not match the lattice constant of the Si. However, in the structure of the invention, due to the growth of the Si:C layer within the S/D regions of the nFET stack 45a, the lattice structure of the Si:C layer will tend to match the lattice structure of the underlying Si. This results in the Si:C layer and the channel regions adjacent or next to the Si:C being under a tensile stress.

In one embodiment, the Si:C and/or the SiGe layer may be embedded within the device by, example, performing a RIE, wet etching or other processes or combinations thereof for processing optimization to recess such layers. Then, Si is selectively grown over the regions 52 and 54 using any well known process. Source and drain implanting may then be performed using any well process. Further processing can be performed to build the devices and interconnects.

As now should be understood, both the Si:C and SiGe layers may be embedded within the device or can be coplanar or raised from the device. In one embodiment, the Si:C and SiGe films are deposited to 10 to 100 nm thick, which provides a more cost-effective way to add stress (compressive or tensile) to the MOSFETs. In the raised embodiment, the Si:C and SiGe layers may be raised above the surface of the device to about 50 nm. It should be recognized that other thicknesses are also contemplated by the invention.

Also, it is also possible to in situ doping the SiGe with P type doping and Si:C with n type doping to form your source and drain regions of the pFET and nFET, respectively.

It should also be understood by those of ordinary skill in the art that the process steps of FIGS. 1d and 1e may be equally be performed prior to the process steps shown in FIGS. 1b and 1c. Also, further processing steps such as, for example, standard ion implantation can be performed to form the S/D regions of the pFETs and nFETs. The formation of the S/D regions, through the ion implantation, is self aligning due to the gate oxide in the nFET and pFET regions acting as a mask during this process.

Figure 2:
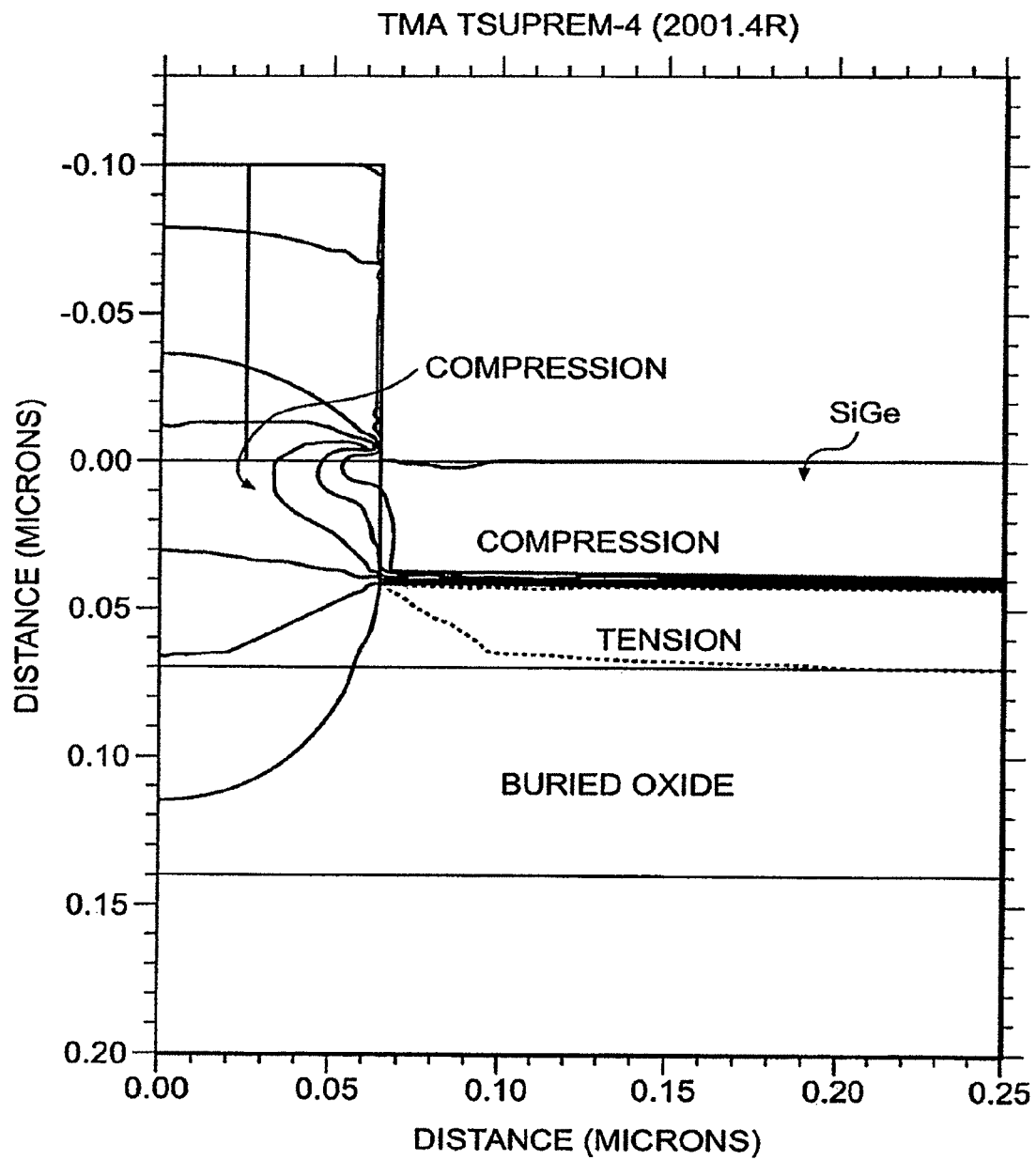
FIG. 2 illustrates the locations of the stresses in an pFET device according to the invention.

FIG. 2 illustrates the locations of the stresses in an nFET device according to the invention. As shown in FIG. 2, compressive stresses are present in just below the pFET with a region of unrelaxed SiGe. More specifically, in the structure of the invention, the lattice structure of the SiGe layer matches the lattice structure of the underlying Si insulation layer. This results in the SiGe layer and the surrounding areas being under a compressive stress.

Figure 3:
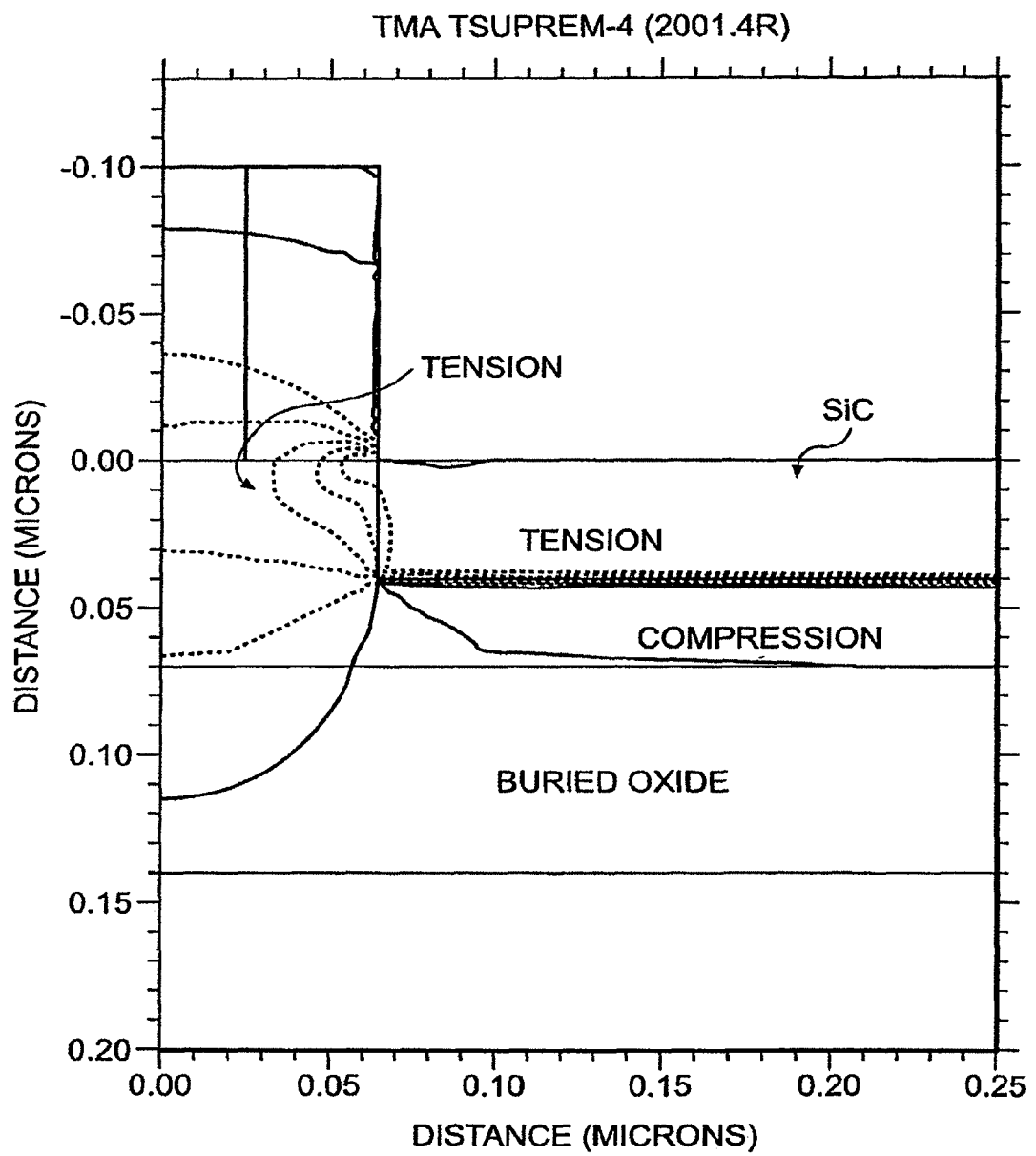
FIG. 3 illustrates the locations of the stresses in an nFET device according to the invention.

FIG. 3 illustrates the locations of the stresses in a nFET device according to the invention. As shown in FIG. 3, tensile stresses are present in the channel of the nFET. More specifically, in the structure of the invention, the lattice structure of the Si:C layer will match the lattice structure of the underlying Si insulation layer 20 to form a tensile stress component in the nFET channel.

While the invention has been described in teams of embodiments, those skilled in the art will recognize that the invention can be practiced with modifications and in the spirit and scope of the appended claims. For example, the invention can be readily applicable to bulk substrates.

What is claimed is:

1. A method of manufacturing a semiconductor structure, comprising:
    forming a pFET stack and an nFET stack on a substrate;
    forming first source/drain regions at the substrate adjacent respective opposing sides of the pFET stack;
    growing a first layer of material at the first source/drain regions associated with the pFET stack, wherein after the growing, the first layer of material has a lattice structure that matches a lattice structure of a first underlying portion of the substrate to create a compressive state within a pFET channel;
    forming second source/drain regions at the substrate adjacent respective opposing sides of the nFET stack, wherein forming the first and second source/drain regions comprises:
        forming a first protection layer;
        forming a first mask on only a portion of the first protection layer and on the nFET stack, the first mask exposing the pFET stack; and
        performing a first etching process using the first mask as an etching mask;
        forming a second protection layer;
        forming a second mask on only a portion of the second protection layer and on the pFET stack, the second mask exposing the nFET stack; and
        performing a second etching process using the second mask as an etching mask; and
    growing a second layer of material at the second source/drain regions associated with the nFET stack, wherein after the growing, the second layer of material has a lattice structure that matches a lattice structure of a second underlying portion of the substrate to create a tensile state within an nFET channel.

2. The method of claim 1, wherein:
    before the first layer of material at the first source/drain regions associated with the pFET is grown, the material forming the first layer has a lattice constant different than a first base lattice constant of the substrate.

3. The method of claim 1, wherein:
    before the second layer of material at the second source/drain regions associated with the nFET is grown, the material forming the second layer has a lattice constant different than a second base lattice constant of the substrate.

4. The method of claim 1, wherein the second layer of material comprises a highly tensile Si:C film to longitudinally apply tension in the nFET channel.

5. The method of claim 4, wherein the second layer of material is embedded in the substrate in the second source/drain regions.

6. The method of claim 5, wherein:
    the second source/drain regions comprise recessed source/drain regions;
    performing the second etching process comprises etching the substrate to form the recessed source/drain regions; and
    growing the second layer of material comprises growing the Si:C in the recessed source/drain regions.

7. The method of claim 6, wherein growing the Si:C comprises epitaxially growing the Si:C in the recessed source/drain regions to a thickness of about 10 to about 100 nm.

8. The method of claim 6, wherein the Si:C has a C concentration of greater than 0% to 4% in ratio to Si.

9. The method of claim 1, wherein the first layer of material associated with the pFET stack is a highly compressive SiGe film to longitudinally apply compression in the pFET channel.

10. The method of claim 9, wherein the first layer of material associated with the pFET stack is embedded in the substrate.

11. The method of claim 10, wherein:
the first source/drain regions comprise recessed source/drain regions;
performing the first etching process comprises etching the substrate to form the recessed source/drain regions; and
growing the first layer of material comprises growing the SiGe in the recessed source/drain regions.

12. The method of claim 11, wherein growing the SiGe comprises epitaxially growing the SiGe in the recessed source/drain regions to a thickness of about 10 to about 100 nm.

13. The method of claim 11, wherein growing the SiGe comprises epitaxially growing the SiGe to protrude above a surface of the substrate.

14. The method of claim 1, wherein:
the first layer of material comprises first and second portions, respectively, adjacent first and second ones of the opposing sides of the pFET stack;
the second layer of material comprises first and second portions, respectively, adjacent first and second ones of the opposing sides of the nFET stack;
the pFET channel comprises a pFET channel region that is between the first and second portions of the first layer of material; and
the nFET channel comprises an nFET channel region that is between the first and second portions of the second layer of material.

15. The method of claim 1, wherein forming the second mask comprises forming the second mask on the first layer of material at the first source/drain regions, and wherein forming the second source/drain regions comprises forming the second source/drain regions with the second mask on the first layer of material at the first source/drain regions.

16. The method of claim 1, wherein forming the second protection layer comprises:
forming the second protection layer on the nFET stack, the pFET stack, and the first source/drain regions, after performing the first etching process using the first mask, and before forming the second mask and the second source/drain regions.

17. The method of claim 1, further comprising forming an isolation region in the substrate, wherein forming the first mask comprises forming the first mask on only a first portion of the isolation region, and wherein forming the second mask comprises forming the second mask on only a second portion of the isolation region.

18. The method of claim 17,
wherein forming the first protection layer comprises forming the first protection layer on the isolation region before forming the first mask, and
wherein forming the second protection layer comprises forming the second protection layer on the isolation region before forming the second mask.

19. A method of manufacturing a semiconductor structure, the method comprising:
forming a pFET stack and an nFET stack on a substrate;
forming first source/drain regions at the substrate adjacent respective opposing sides of the pFET stack, wherein forming the first source/drain regions comprises:
forming a first protection layer;
forming a first mask on the nFET stack and partially on the first protection layer; and
performing a first etching process using the first mask as an etching mask;
growing a first layer of material at the first source/drain regions associated with the pFET stack, wherein the first layer of material provides a compressive state in a pFET channel associated with the pFET stack;
forming second source/drain regions at the substrate adjacent respective opposing sides of the nFET stack, wherein forming the second source/drain regions comprises:
forming a second protection layer;
forming a second mask on the pFET stack and partially on the second protection layer; and
performing a second etching process using the second mask as an etching mask; and
growing a second layer of material at the second source/drain regions associated with the nFET stack, wherein the second layer of material provides a tensile state in an nFET channel associated with the nFET stack.

20. The method of claim 19,
wherein an isolation region is in the substrate between the pFET stack and the nFET stack,
wherein forming the first mask comprises forming the first mask on the nFET stack and partially on the first protection layer to expose a portion of the first protection layer on the isolation region, and
wherein forming the second mask comprises forming the second mask on the pFET stack and partially on the second protection layer to expose a portion of the second protection layer on the isolation region.

* * * * *